United States Patent

Morioka et al.

[11] Patent Number: 6,104,471
[45] Date of Patent: Aug. 15, 2000

[54] EXPOSURE APPARATUS AND METHOD WHEREIN THE MAGNIFICATION OF THE PROJECTION OPTICAL SYSTEM COMPENSATES FOR PHYSICAL CHANGES IN THE SUBSTRATE

[75] Inventors: Toshinobu Morioka, Fujisawa; Muneyasu Yokota, Tokyo, both of Japan

[73] Assignee: Nikon Corporation, Tokyo, Japan

[21] Appl. No.: 08/933,949

[22] Filed: Sep. 19, 1997

Related U.S. Application Data

[63] Continuation-in-part of application No. 08/669,238, Jun. 24, 1996, abandoned.

[30] Foreign Application Priority Data

Jun. 26, 1995 [JP] Japan ................................ 7-182170

[51] Int. Cl.$^7$ ............................. G03B 27/42; G01B 11/00
[52] U.S. Cl. .............................. 355/53; 355/55; 356/399; 356/400; 356/401
[58] Field of Search .................. 355/55, 53, 50, 355/56; 356/399, 400, 401

[56] References Cited

U.S. PATENT DOCUMENTS 5,298,761  3/1994  Aoki et al. ........................... 250/548
5,448,333  9/1995  Iwamoto et al. .

*Primary Examiner*—R. L. Moses
*Assistant Examiner*—Shival Virmani
*Attorney, Agent, or Firm*—Oliff & Berridge, PLC

[57] ABSTRACT

When alignment marks, which have been previously formed on a substrate corresponding to each of two orthogonal axial directions, are detected by a microscope, a main control unit detects positions and numbers of the respective marks, and calculates stretching degrees of the substrate in the two orthogonal axial directions respectively on the basis of information on the detected positions of specified marks and information on designed positions of the specified marks. The main control unit determines a mean value of the stretching degrees by weighting each of the calculated stretching degrees in the two orthogonal axial directions in accordance with the detected numbers of the marks corresponding to each of the two orthogonal axial directions so that the determined weighted mean value of the stretching degrees is set as a magnification correction value. A magnification controller corrects, through a magnification-adjusting mechanism, a magnification of a projection optical system on the basis of the set magnification correction value. When stretching of the substrate takes place, the pattern continuity and the overlay accuracy in an intended privileged direction can be improved.

31 Claims, 7 Drawing Sheets

EXPOSURE APPARATUS AND METHOD WHEREIN THE MAGNIFICATION OF THE PROJECTION OPTICAL SYSTEM COMPENSATES FOR PHYSICAL CHANGES IN THE SUBSTRATE

This is a continuation of application Ser. No. 08/669,238 filed Jun. 24, 1996 now abandoned.

BACKGROUND OF THE INVENTION

1. Field of the Invention

The present invention relates to an exposure apparatus. In particular, the present invention relates to an exposure apparatus for transferring, successively in a stitching manner, a pattern formed on a mask through a projection optical system onto a plurality of areas existing continuously on a substrate.

2. Description of the Related Art

Those hitherto known as exposure apparatuses for producing liquid crystal displays (LCD) include an apparatus of the so-called step-and-repeat system in which a predetermined area on a glass plate for liquid crystal (hereinafter referred to as "plate", if necessary) is exposed with a part of a pattern formed on a reticle (mask), and then the plate is subjected to stepping over a certain distance, followed by repeated exposure with other parts of the pattern on the reticle again and again.

In order to achieve precise positional adjustment for the reticle and the plate, the exposure apparatus as described above has a reticle stage for moving the reticle in a plane perpendicular to an optical axis of a projection optical system, and a plate stage for moving the plate in a plane perpendicular to the optical axis of the projection optical system. The exposure apparatus further has a magnification controller for controlling the projection magnification of the projection optical system so that a pattern on the reticle is projected at a predetermined magnification onto the plate. The control for the projection magnification is required for the following situation.

In order to produce a liquid crystal display, it is necessary that a pattern formed on a reticle is projected onto a pattern previously formed on a plate so that the former is overlaid on the latter. However, an area on the plate (shot area) with a pattern having been transferred upon exposure for a previous layer occasionally undergo stretching due to stretching of the plate caused by processes applied after the exposure for the previous layer. When overlay exposure is performed under such a condition, if the projection magnification of the projection optical system is left fixed, then it is impossible to precisely overlay and transfer a pattern formed on the reticle onto the shot area. Accordingly, in such a situation, the projection magnification is adjusted by using the magnification controller.

In the conventional exposure apparatus as described above, the projection magnification has been controlled as follows. When a secondly applied resist film (resist film applied after exposure and development for a firstly applied resist film) or a resist film applied thereafter is exposed, positions of alignment marks formed on the plate are detected prior to exposure for each layer. Degrees of stretching of the plate in two-dimensional directions are calculated on the basis of a result of the detection. Specifically, a scaling in the x direction (designated as $\gamma_x$) and a scaling in the y direction (designated as $\gamma_y$) are calculated provided that the plate stage is movable in the x direction. A simple mean value m of them ($m=(\gamma_x+\gamma_y)\times\frac{1}{2}$) is set as a magnification correction value, and the magnification controller controls the projection magnification of the projection optical system on the basis of the magnification correction value m. Thus the projection magnification has been hitherto automatically corrected.

However, the conventional technique as described above often failed to precisely overlay the pattern both in the x and y directions, as based on the correction for the projection magnification of the projection optical system by using the magnification correction value calculated as the simple mean value of the scalings in the x and y directions.

Namely, as shown in FIG. 7, an inconvenience as described below has often occurred. It is assumed that a shot area originally occupied an area S illustrated by dotted lines has expanded to an area S' illustrated by solid lines upon exposure for a second layer or followings as a result of expansion of a plate caused by downstream processes. If the projection magnification is corrected on the basis of the simple mean value m of the scalings in the x and y directions, the pattern is transferred only in an area narrower than each shot area in the x direction, while the pattern is transferred beyond each shot area in the y direction, as illustrated by hatched line sections in FIG. 7.

In the exposure for producing liquid crystal displays, the requirement for the overlay accuracy and the continuity of patterns at a stitching section to patch mutually adjoining shot areas is not necessarily at the same level in the x and y directions. A preference is afforded in many cases to the pattern continuity and the overlay accuracy in any one of the x and y directions depending on a direction of the pattern. For example, when a thin film transistor (TFT) is formed, source and drain layers are subjected to overlay exposure on a gate layer having been formed by first exposure. In this procedure, it is necessary to lay emphasis on a direction along which the source and drain layers are overlaid. In such a case, it is clear that no satisfactory result is obtained by using the conventional technique as described above.

SUMMARY OF THE INVENTION

An object of the present invention is to dissolve the drawback of the conventional technique as described above, and provide an exposure apparatus and an exposures method in which the pattern continuity and the overlay accuracy in an intended preferential direction can be improved when a substrate is stretched.

According to a first aspect of the present invention, there is provided an exposure apparatus for transferring, successively in a stitching manner, a pattern formed on a mask through a projection optical system onto a plurality of areas existing continuously on a substrate, comprising:

a stage for placing the substrate thereon and movable in two orthogonal axial directions;

a mark detector for detecting positions of alignment marks previously formed in the two orthogonal axial directions on the substrate;

a magnification-correcting unit for correcting a magnification of the projection optical system on the basis of a magnification correction value to be set;

a calculating unit for calculating stretching degrees of the substrate in the two orthogonal axial directions respectively on the basis of information on the positions of the alignment marks detected by the detector and information on designed positions of the alignment marks; and a setting unit for determining a weighted mean value of the stretching degrees by weighting each of the calculated stretching degrees in the two orthogonal axial directions by using predetermined ratios so that the weighted mean value is set as the magnification correction value.

According to the present invention, when the positions of the alignment marks, which have been previously formed on the substrate corresponding to each of the two orthogonal axial directions, are detected by the mark detector, the calculating unit calculates the stretching degrees of the substrate in the two orthogonal axial directions on the basis of the information on the positions of the specified alignment marks detected by the detector and the information on the designed positions of the specified alignment marks. When the stretching degrees are calculated, the setting unit determines the mean value of the stretching degrees by weighting each of the calculated stretching degrees in the two orthogonal axial directions by using predetermined ratios, for example, in conformity with a direction in which strict pattern continuity is required so that the determined weighted mean value of the stretching degrees is set as the magnification correction value. The magnification-correcting unit corrects the magnification of the projection optical system on the basis of the set magnification correction value.

Accordingly, the projection magnification of the projection optical system is previously corrected in conformity with an intended prioritized direction by affording a preference to the stretching degree in the direction. Therefore, when the pattern formed on the mask is transferred through the projection optical system onto the substrate in a state in which the magnification correction has been performed, the pattern continuity and the overlay accuracy can be improved in the intended prioritized direction for the plurality of areas mutually existing continuously on the substrate.

The mark detector may detect numbers of the marks, and the setting unit may determine the weighted mean value of the stretching degrees by weighting each of the stretching degrees in the two orthogonal axial directions in conformity with the detected numbers of the marks. In such an embodiment, a larger number of the alignment marks in conformity with the intended prioritized direction are previously formed on the substrate. Thus the projection magnification of the projection optical system is corrected by affording a preference to the stretching degree in the direction corresponding to the formation of the marks as described above.

The exposure apparatus of the present invention may be constructed as a projection exposure apparatus of the step-and-repeat type or the step-and-scan type. Moreover, it is applicable to any one of an apparatus for producing semiconductor devices and an apparatus for producing liquid crystal substrates.

According to a second aspect of the present invention, there is provided an exposure apparatus for transferring, successively in a stitching manner, a pattern formed on a mask through a projection optical system onto a plurality of areas existing continuously on a substrate, comprising:

a stage for placing the substrate thereon and movable in two orthogonal axial directions;

a mark detector for detecting positions and numbers of alignment marks previously formed on the substrate corresponding to the two orthogonal axial directions respectively;

a magnification-correcting unit for correcting a magnification of the projection optical system on the basis of a magnification correction value to be set;

a calculating unit for calculating stretching degrees of the substrate in the two orthogonal axial directions respectively on the basis of information on the positions of the alignment marks detected by the detector and information on designed positions of the alignment marks; and a setting unit for determining a weighted mean value of the stretching degrees by weighting each of the calculated stretching degrees in the two orthogonal axial directions in accordance with the numbers of the alignment marks corresponding to the respective axial directions detected by the detector so that the determined weighted mean value of the stretching degrees is set as the magnification correction value.

According to a third aspect of the present invention, there is provided an exposure method for transferring, successively in a stitching manner, a pattern formed on a mask through a projection optical system onto a plurality of areas existing continuously on a substrate, comprising the steps of:

detecting positions of alignment marks previously formed in two orthogonal axial directions on the substrate;

calculating stretching degrees of the substrate in the two orthogonal axial directions respectively on the basis of information on the detected positions of the alignment marks and information on designed positions of the alignment marks;

determining a weighted mean value of the stretching degrees by weighting each of the calculated stretching degrees in the two orthogonal axial directions in conformity with an intended prioritized axial direction;

adjusting a magnification of the projection optical system on the basis of the determined weighted mean value of the stretching degrees; and exposing, at the adjusted magnification, the plurality of areas existing continuously on the substrate with the pattern formed on the mask by means of projection in the stitching manner.

According to the exposure method of the present invention, the projection magnification of the projection optical system is previously corrected in conformity with an intended prioritized direction by affording a preference to the stretching degree in the direction. Therefore, when the pattern formed on the mask is transferred through the projection optical system onto the substrate in a state in which the magnification correction has been performed, the pattern continuity and the overlay accuracy can be improved in the intended prioritized direction mutually for the plurality of areas existing continuously on the substrate.

In the exposure method of the present invention, not only the positions of the alignment marks but also the numbers thereof may be detected, and the stretching degrees in the respective two orthogonal axial directions may be weighted in conformity with the detected numbers of the marks. Alternatively, one of the two orthogonal axial directions may be allowed to have a weighting coefficient of 1 for the stretching degree, and the other of the two orthogonal axial directions may be allowed to have a weighting coefficient of 0 for the stretching degree.

According to a fourth aspect of the present invention, there is provided an exposure method for transferring patterns formed on masks through a projection optical system onto a substrate, comprising the steps of:

transferring, successively in a stitching manner, a pattern onto a plurality of areas existing continuously on the substrate, the pattern including alignment marks formed in two orthogonal axial directions on a mask;

detecting positions of alignment marks transferred in two orthogonal axial directions on the substrate;

calculating stretching degrees of the substrate in the two orthogonal axial directions respectively on the basis of information on the detected positions of the alignment marks and information on designed positions of the alignment marks;

determining a weighted mean value of the stretching degrees by weighting each of the calculated stretching degrees in the two orthogonal axial directions in conformity with an intended prioritized axial direction;

adjusting a magnification of the projection optical system on the basis of the determined weighted mean value of the stretching degrees; and transferring, in the stitching manner at the adjusted magnification, an another pattern formed on another mask onto the plurality of areas existing continuously on the substrate.

DETAILED DESCRIPTION OF PREFERRED EMBODIMENTS

An embodiment of the present invention will be explained below with reference to FIGS. 1 to 6, however, the present invention is not limited thereto.

Figure 1:
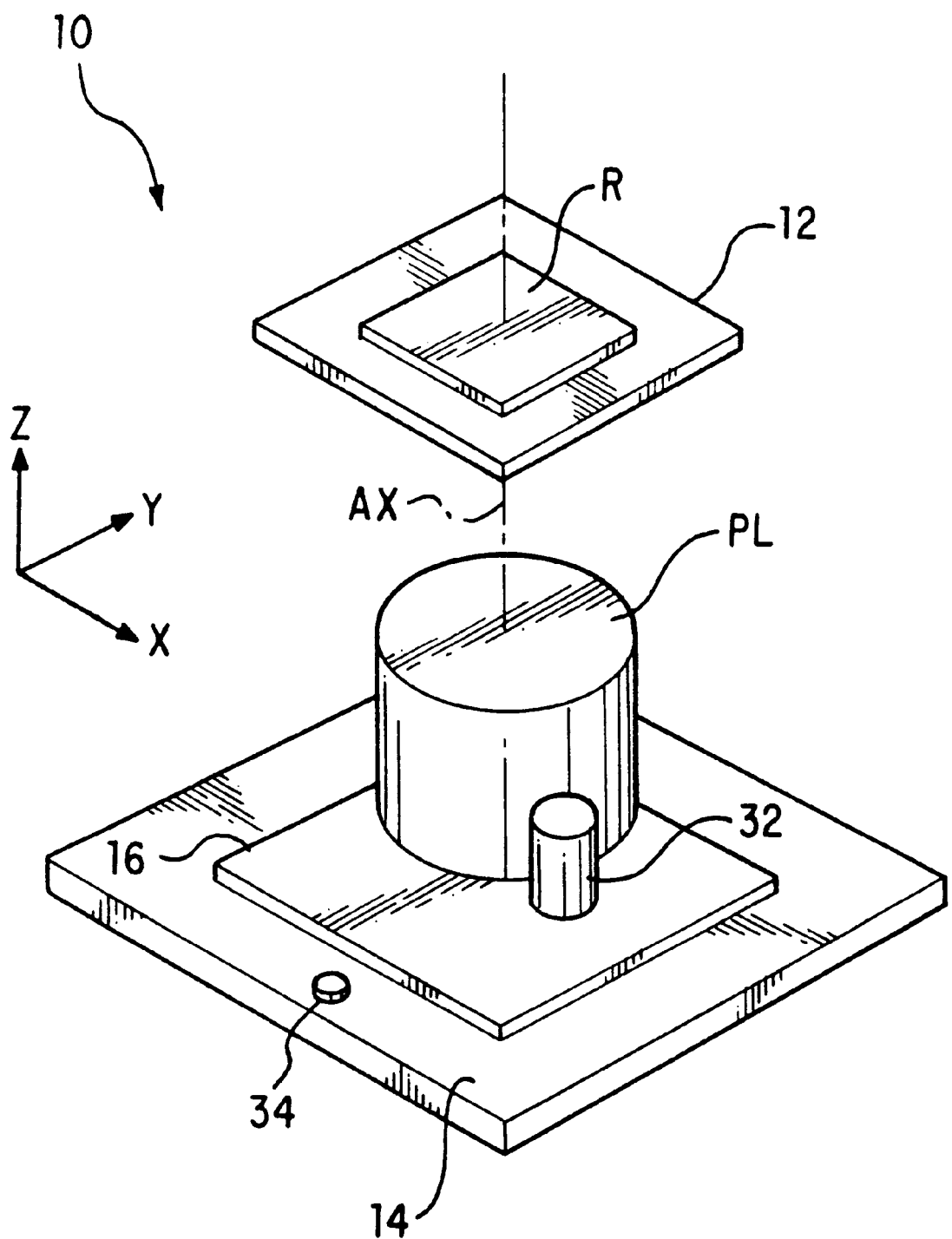
FIG. 1 shows a perspective view illustrating a schematic arrangement of an exposure apparatus according to an embodiment of the present invention.

FIG. 1 shows a schematic arrangement of an exposure apparatus 10 according to an embodiment of the present invention. The exposure apparatus 10 comprises a projection optical system PL, a reticle stage 12 arranged over the projection optical system PL, the reticle stage 12 being movable two-dimensionally in x and y directions and rotatable in a plane perpendicular to a z-axial direction which is coincident with a direction of an optical axis AX of the projection optical system PL, and a plate stage 14 arranged under the projection optical system PL, the plate stage 14 being movable two-dimensionally in the x and y directions in a plane parallel to the plane in which the reticle stage 12 is movable.

A reticle R used as a mask is placed on the reticle stage 12, which is attracted by an unillustrated vacuum-attracting means. The reticle R has its back surface used as a pattern plane on which a circuit pattern is formed in a predetermined area.

A liquid crystal plate (hereinafter referred to as "plate") 16 used as a substrate, on a surface of which a photoresist is applied, is placed on the plate stage 14, which is attracted by and secured to an unillustrated plate holder.

The surface of the plate 16 and the pattern plane on the reticle R are conjugate relative to the projection optical system PL. Accordingly, when the pattern plane on the reticle R is illuminated with exposure light emitted from an unillustrated illumination optical system, the pattern formed on the reticle R is projected and transferred through the projection optical system PL onto the plate 16.

The reticle stage 12 is actually driven by a reticle stage driving system 18 (see FIG. 3) two-dimensionally in the x and y directions and in the rotating direction (θ direction) about the z axis as described above. The reticle stage driving system 18 is controlled by a reticle stage controller 20.

The plate stage 14 is actually driven by a plate stage driving system 22 (see FIG. 3) two-dimensionally in the x and y directions as described above. The plate stage driving system 22 is controlled by a plate stage controller 24 (see FIG. 3). The position of the plate stage during movement is actually measured by a highly accurate position-measuring means such as a laser interferometer 26 (unillustrated in FIG. 1, see FIG. 3).

Figure 3:
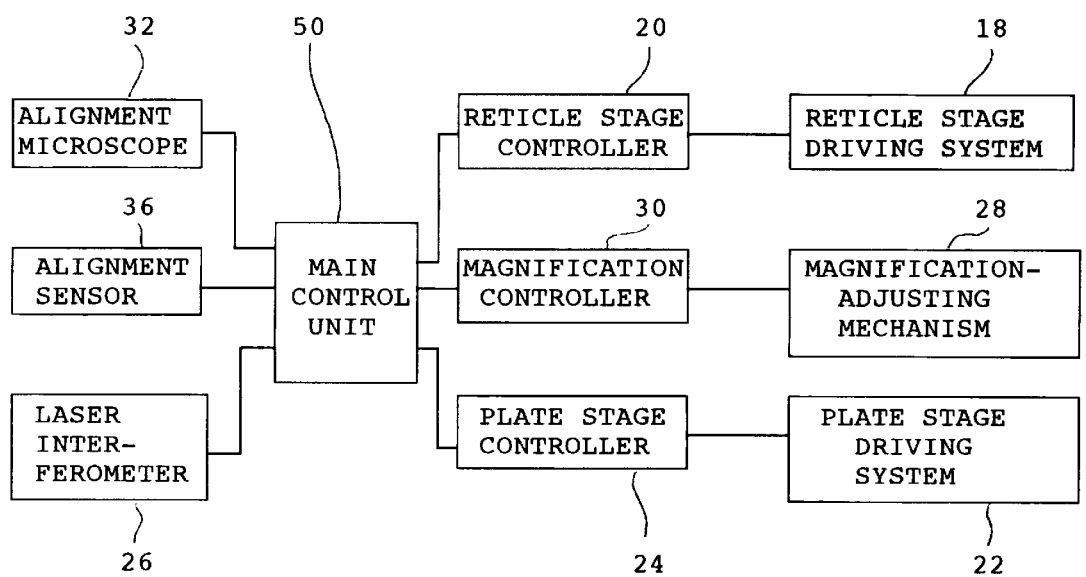
FIG. 3 shows a block diagram illustrating a schematic arrangement of a control system of the apparatus in FIG. 1.

The projection optical system PL has its magnification which is actually adjusted by a magnification-adjusting mechanism 28 (see FIG. 3). The magnification-adjusting mechanism 28 is controlled by a magnification controller 30. In this embodiment, those usable as the magnification-adjusting mechanism include, for example, a magnification-adjusting mechanism as disclosed in Japanese Patent Laid-open No. 60-78454 (U.S. Pat. No. 4,666,273) in which a gas (such as air) is enclosed in a specified space between a plurality of lens elements for constructing a projection optical system so that a magnification (or focal point) is changed by changing a refractive index of the space by changing a pressure of the enclosed gas. Alternatively, it is also preferable to use a magnification-adjusting mechanism as disclosed in U.S. Pat. No. 5,117,255 in which a projection magnification is changed by moving a specified lens element for constructing a projection optical system in a direction of an optical axis. U.S. Pat. Nos. 4,666,273 and 5,117,255 are incorporated herein by reference.

An alignment microscope 32 is arranged in the vicinity of the projection optical system PL. The alignment microscope 32 has a predetermined relationship with respect to the optical axis of the projection optical system PL. Alignment marks, which are formed on the plate 16 placed on the plate stage 14 as described later on, are measured by the alignment microscope 32.

Figure 2:
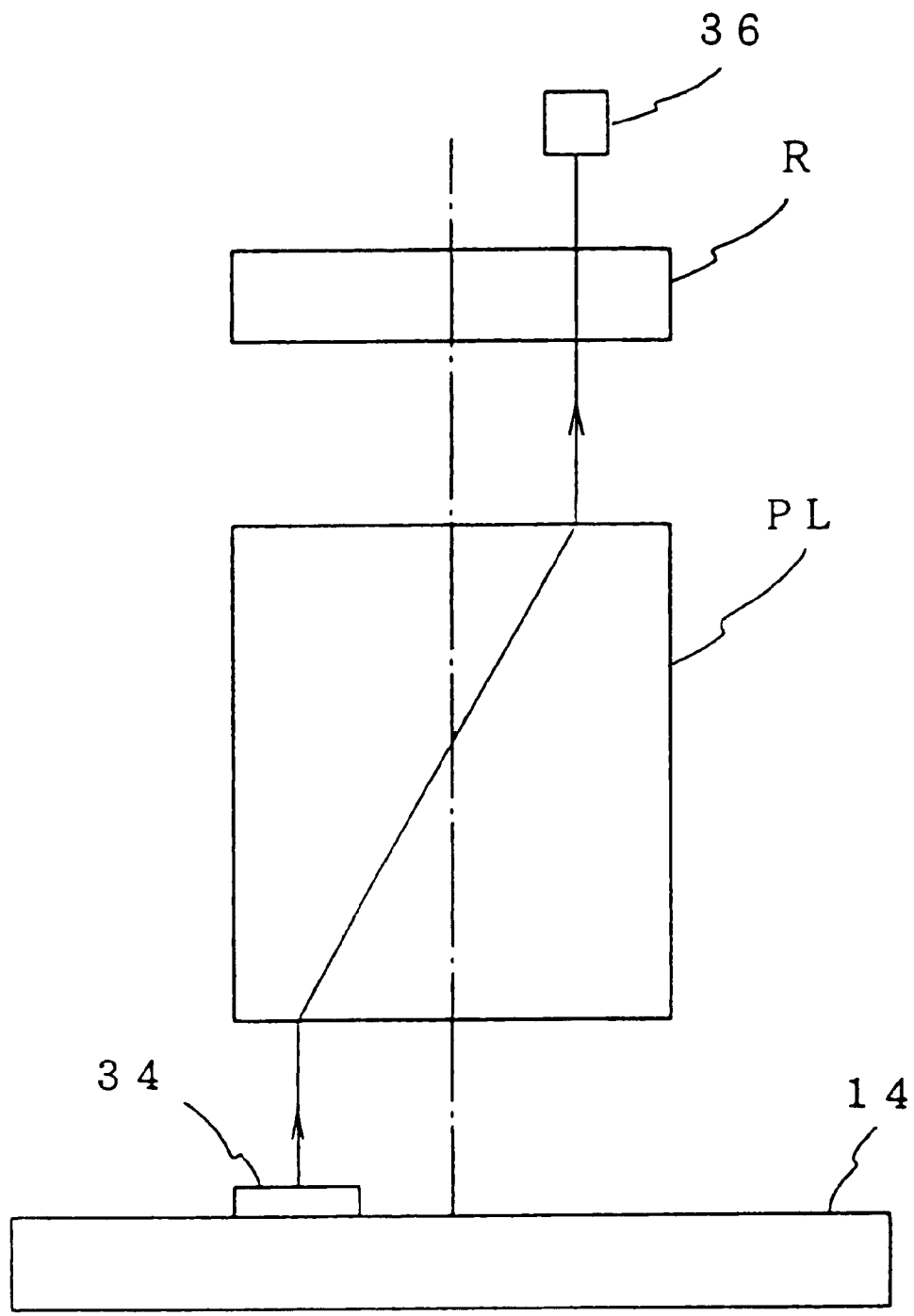
FIG. 2 shows a schematic illustration for explaining a method for measuring reticle alignment marks.

A reference light source 34 is provided on the plate stage 14, which constitutes a reticle alignment system for measuring reticle alignment marks formed on the reticle R. When the reticle R is placed on the reticle stage 12, the plate stage controller 24 (see FIG. 3) controls movement of the plate stage 14 through the plate stage driving system 22 (see FIG. 3) so that a light beam emitted from the reference light source 34 scans the reticle alignment marks formed on the reticle R through the projection optical system PL as shown in FIG. 2. Upon this scanning, positions of the reticle alignment marks in a movement coordinate system for the plate stage 14 can be known on the basis of an amount of transmitted light received by an alignment sensor 36 and an output of the laser interferometer 26. On the basis of the positions of the reticle alignment marks, the reticle stage controller 20 moves the reticle stage 12 in the x, y, and θ directions through the reticle stage driving system 18 to perform alignment for the reticle R. When a system is used in which the reticle stage 12 cannot be moved in the x, y, and θ directions, correction may be made by moving the plate stage 14 in an amount corresponding to an amount of movement of the reticle stage 12.

FIG. 3 shows a schematic arrangement of a control system of the exposure apparatus 10. The control system comprises a main control unit 50 composed of a microcomputer or a minicomputer to serve as a central unit. Those connected to an input side of the main control unit 50 include, for example, the laser interferometer 26, the alignment microscope 32, and the alignment sensor 36. Those connected to an output side of the main control unit 50 include, for example, the reticle stage controller 20, the plate stage controller 24, and the magnification controller 30. In this arrangement, the reticle stage controller 20, the plate stage controller 24, and the magnification controller 30 send control commands to the reticle stage driving system 18, the plate stage driving system 22, and the magnification-adjusting mechanism 28 respectively on the basis of control signals from the main control unit 50.

Next, an operation of the exposure apparatus 10 constructed as described above will be explained.

<Exposure for First Layer>

Figure 4A:
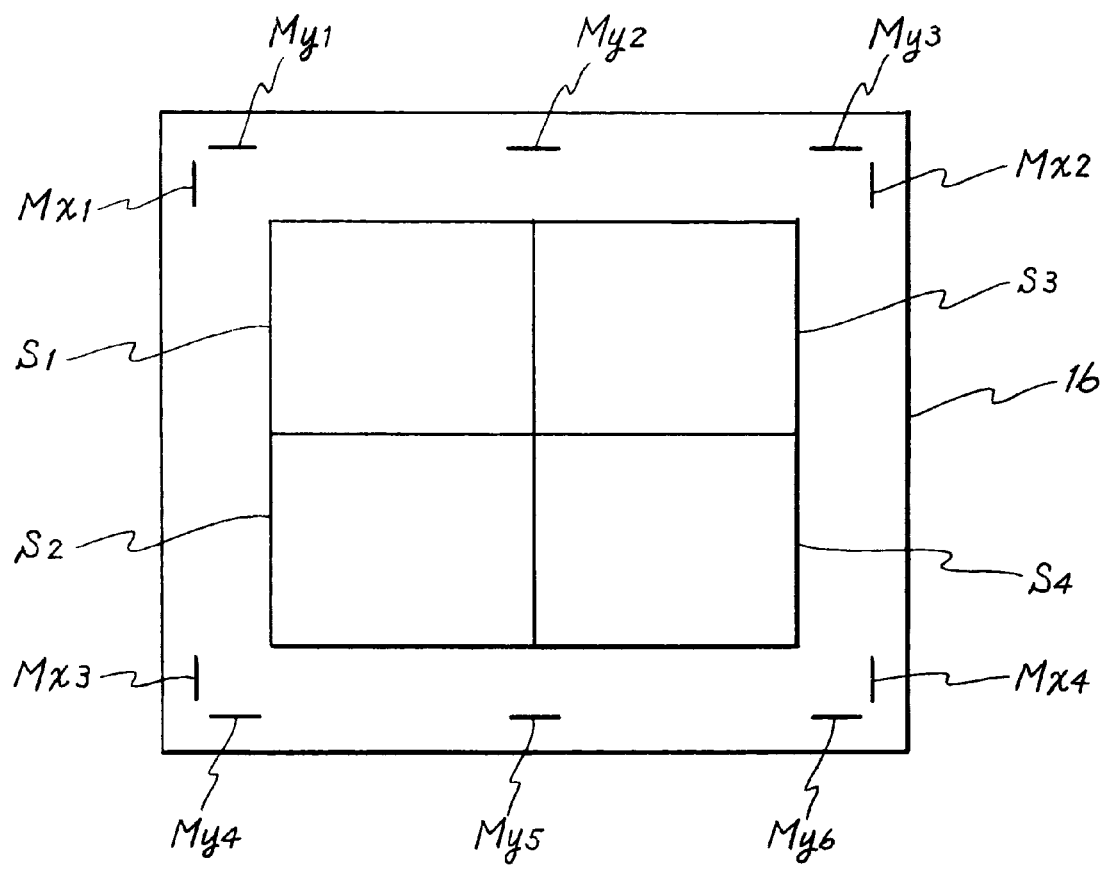
FIG. 4A shows a plane view of the plate including a shot area before an expansion of the plate.

After the reticle alignment is performed as described above, the plate 16 is placed on the plate stage 14. A first layer of a photoresist is previously applied to the plate 16. The plate stage controller 20 and relating devices are controlled by the main control unit 50 in accordance with a predetermined procedure. Stepping of the plate stage 14 and exposure are repeated in accordance with a so-called step-and-repeat operation. Thus a first layer of a reticle pattern (reticle pattern with which the first layer of the resist is intended to be exposed) is transferred. As a result, for example, as shown in FIG. 4A, a plurality of (in this embodiment, four) shot areas $S_1$, $S_2$, $S_3$, $S_4$ are formed in a predetermined area on the plate 16. In this formation, a continuous pattern exists in the adjoining shot areas. When the first layer of the resist is exposed, alignment marks are also formed on the plate 16. The alignment marks include, for example, alignment marks $M_{x1}$, $M_{x2}$, $M_{x3}$, $M_{x4}$ for positioning in the x direction, and alignment marks $M_{y1}$, $M_{y2}$, $M_{y3}$, $M_{y4}$, $M_{y5}$, $M_{y6}$ for positioning in the y direction.

Figure 4B:
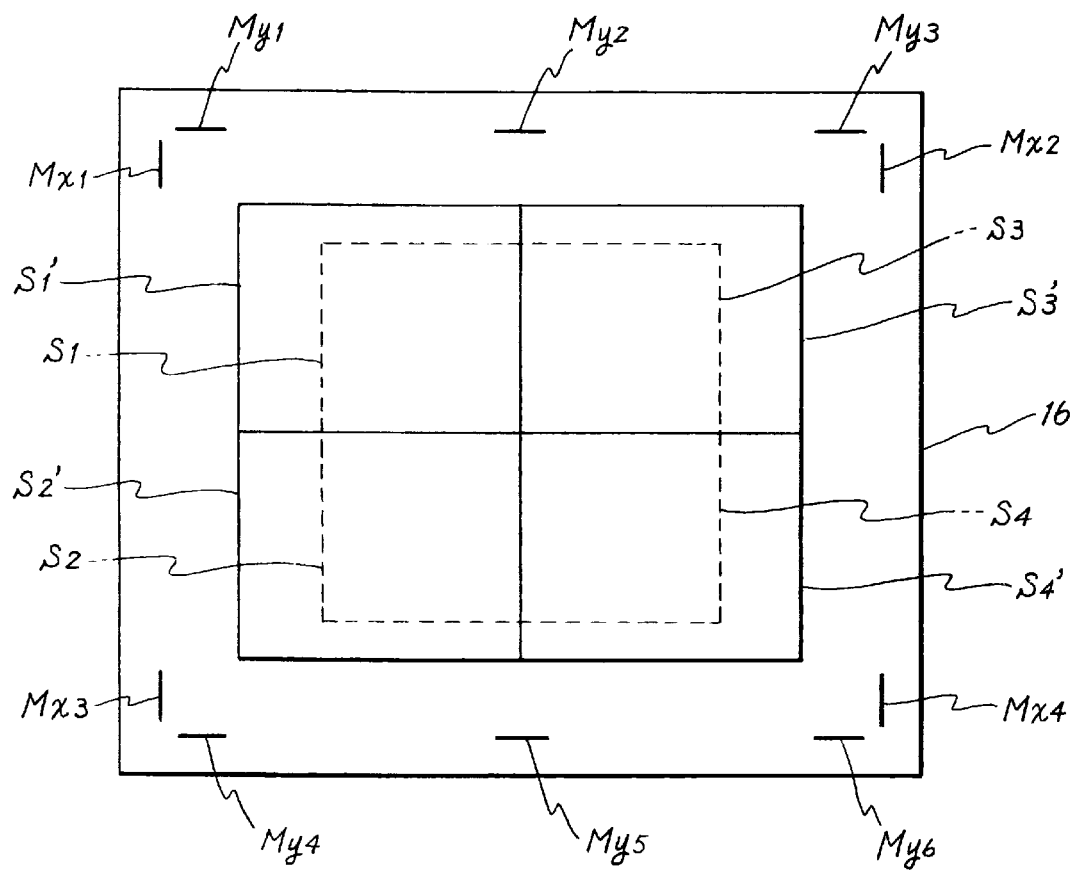
FIG. 4B shows a plane view of the plate shown in FIG. 4A after the expansion of the plate.

After the first layer of the resist is exposed, process treatments such as development, etching, and other treatments are performed. As a result of such processes, the plate 16 is expanded as shown in FIG. 4B. It is assumed that the shot areas shown by dotted lines $S_1$, $S_2$, $S_3$, $S_4$, are enlarged to shot areas shown by solid lines $S_1'$, $S_2'$, $S_3'$, $S_4'$.

<Exposure for Second Layer>

Figure 5:
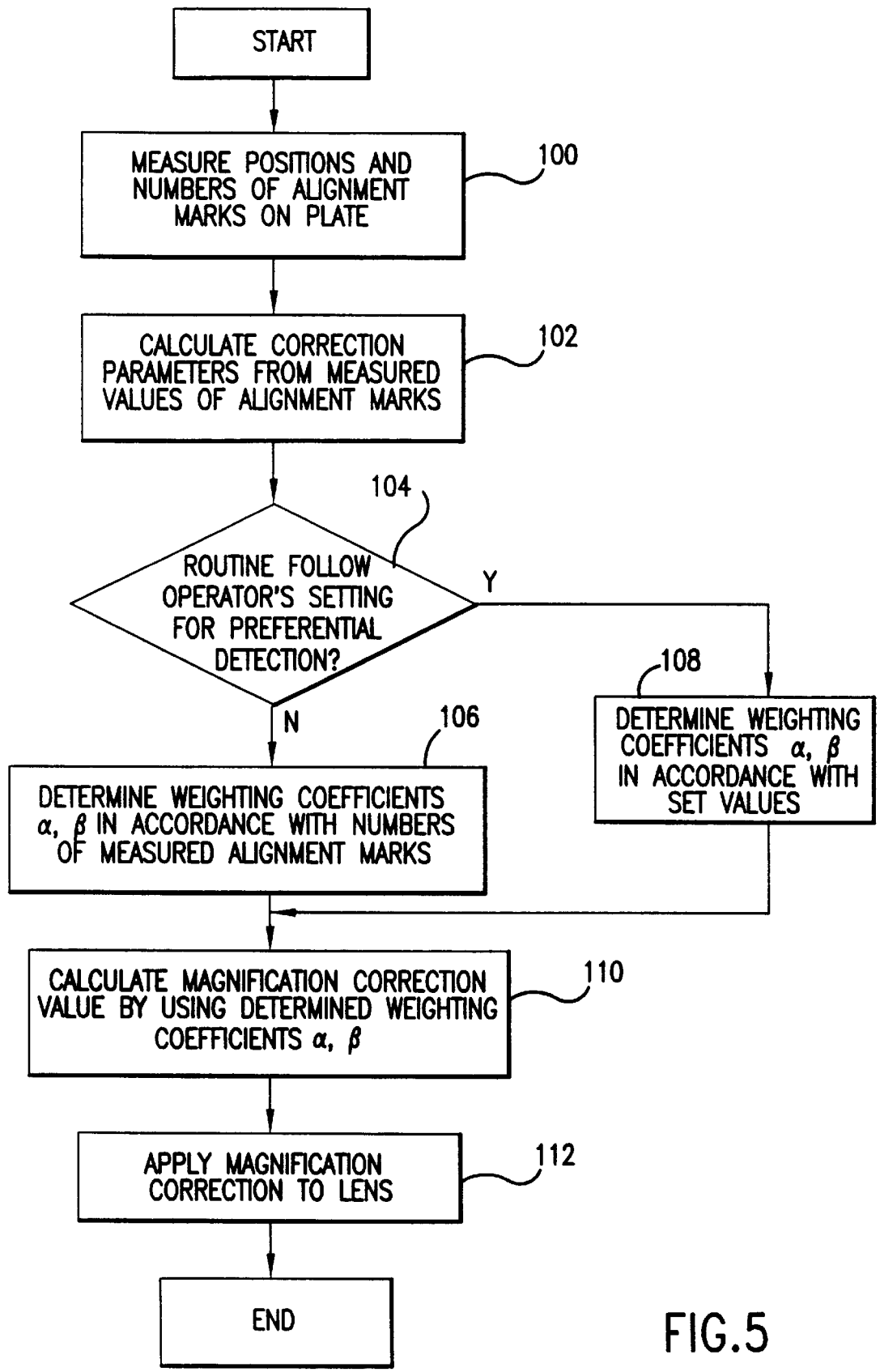
FIG. 5 shows a flow chart illustrating a principal control algorithm for a main control unit.

Now a routine will be explained with reference to a flow chart in FIG. 5 illustrating a principal control algorithm for the main control unit 50. It is assumed herein that an operator designates neither preferential direction nor projection magnification. It is premised that the plate 16 shown in FIG. 4B, in which a photoresist (second layer of a resist) is applied to its surface, is placed on the plate stage 14, and the plate 16 is attracted by and secured to the unillustrated holder.

In a step 100, the main control unit 50 measures (detects) the position and the number of the alignment marks on the plate 16. Specifically, the position and the number of the alignment marks are measured such that the main control unit 50 controls the plate stage driving system 22 through the stage controller 24 to drive the plate stage 14 two-dimensionally in the x and y directions while monitoring outputs from the alignment microscope 32 and the laser interferometer 26. Results of the measurement are stored in an unillustrated memory in the main control unit 50.

In the next step 102, each of correction parameters is calculated on the basis of measured values obtained in the step 100. The correction parameters are provided because errors arise in the positions of the alignment marks due to, for example, stretching of the plate 16 and alignment errors. Thus the correction parameters are provided in order to determine actual array coordinates subjected to positional adjustment with respect to designed array coordinates of the alignment marks. The correction parameters are used to allow the designed array coordinates of the alignment marks to respond to the actual array coordinates subjected to positional adjustment (positions of the alignment marks corrected by using the correction parameters) in accordance with the following expression (1). Calculation is performed by the main control unit 50. A method for calculating each of the correction parameters will be described in detail below. A least square method is used as the calculation method (analyzing method).

$$\begin{pmatrix} X_i' \\ Y_i' \end{pmatrix} = \begin{pmatrix} 1+\gamma_x \times 10^{-5} & -(\theta+\omega) \times 10^{-5} \\ \theta \times 10^{-5} & 1+\gamma_y \times 10^{-5} \end{pmatrix} \begin{pmatrix} X_i \\ Y_i \end{pmatrix} + \begin{pmatrix} \varepsilon_x \\ \varepsilon_y \end{pmatrix} \quad (1)$$

($X_i$, $Y_i$): designed position of alignment mark;

($X_i'$, $Y_i'$): position of alignment mark corrected by correction parameters.

Each of the correction parameters is provided as follows. However, it is assumed that the plate is subjected to stretching at stretching degrees of $\gamma_x$, $\gamma_y$ due to expansion of the plate, and the plate is subjected to rotation in the plate plane by an angle of θ or subjected to positional shift by distances of $\varepsilon_x$, $\varepsilon_y$ due to, for example, alignment errors of the plate.

(1) plate scaling (stretching): $\gamma_x$ (x direction), $\gamma_y$ (y direction) [ppm];

(2) plate rotation: θ [μrad];

(3) orthogonality (orthogonality error by using the x axis as a reference): ω [μrad]; and (4) plate shift: $\varepsilon_x$ (x direction), $\varepsilon_y$ (y direction) [μm].

Each of the correction parameters are determined by determining each of elements of a conversion matrix represented by the following expression (2) so as to minimize a sum of squares of differences between measured values and actual array coordinate converted on the basis of the expression (1) described above.

$$S = \sum_{i=1}^{N} (X_i'' - X_i')^2 + \sum_{j=1}^{M} (Y_j'' - Y_j')^2 \quad (2)$$

$X_i''$: measured position of alignment mark in X direction;

$Y_i''$: measured position of alignment mark in Y direction;

$X_i'$: measured position of alignment mark in X direction converted by expression (1); wherein $Y_i'$: measured position of alignment mark in Y direction converted by expression (1); wherein $X_i'$ and $Y_i'$ are functions of correction parameters.

Values of the respective correction parameters thus determined are stored in the memory.

In the next step 104, the main control unit 50 accesses a predetermined memory area to confirm its content so that it is judged whether or not the routine follows operator's setting for the preferential direction. In this embodiment, the operator has made no designation as described above. Accordingly, the judgment in the step 104 is negated, and the routine proceeds to a step 106 to determine weighting coefficients α, β in the x and y directions in accordance with the numbers of the measured alignment marks.

Specifically, it is assumed that the number of the alignment marks corresponding to the x direction is N, and the number of the alignment marks corresponding to the y direction is M, which have been stored in the memory in the step 100. Those weighted in the respective directions are α=N/(N+M) in the x direction, and β=M/(N+M) in the y direction. In the embodiment illustrated in FIG. 4, there are given α=0.4 and β=0.6 because of N=4 and M=6.

In a step 110, the main control unit 50 determines the magnification correction value m [ppm] in accordance with the determined weighting coefficients α, β. Specifically, the main control unit 50 determines a weighted mean value m =αγ$_x$+βγ$_y$ obtained by weighting, with the weighting coefficients α, β, the plate scaling correction parameters (stretching degrees) γ$_x$, γ$_y$ determined in the step 102 described above. In the embodiment illustrated in FIG. 4, there is given m=0.4γ$_x$+0.6γ$_y$. Thus a magnification correction value is calculated, in which a preference is afforded to the y direction (the y direction is prioritized).

In the final step 112, the main control unit 50 sends the magnification correction value m determined in the step 110 to the magnification controller 30. After that, a series of processes of this routine are ended. Thus the magnification-adjusting mechanism 28 is controlled by the magnification controller 30 in accordance with the magnification correction value m, and the projection magnification of the projection optical system PL is adjusted.

After the adjustment for the projection magnification, a step-and-repeat operation is performed for exposing the second layer. In this operation, each shot is subjected to positioning in accordance with the value of each of the correction parameters previously calculated and stored in the memory in the step 102. In the case of an arrangement in which the reticle stage 12 cannot be moved in the x and y directions, correction may be made such that discrepancy amounts in the respective x and y directions from a target position are used as offsets for positioning.

Figure 6:
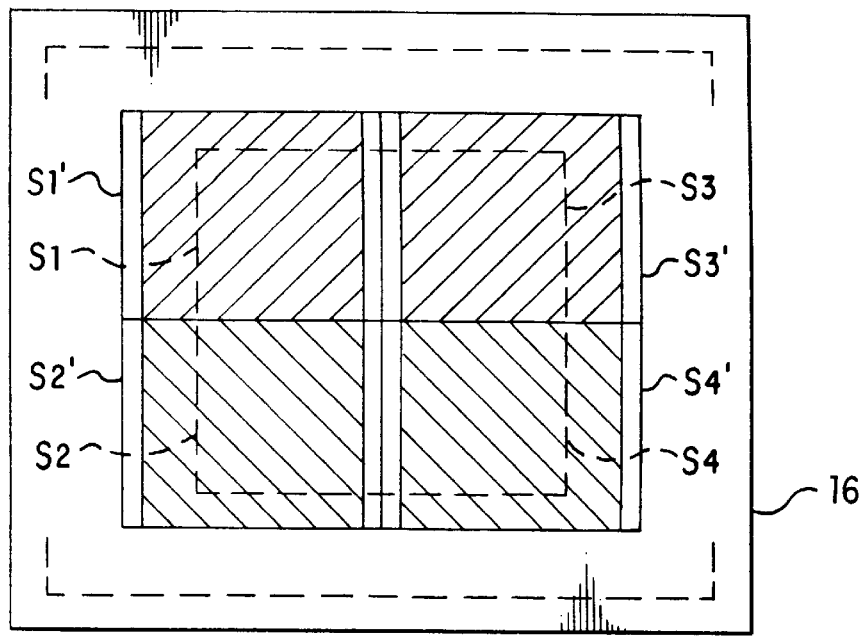
FIG. 6 shows a state in which a pattern is subjected to overlay exposure onto a plate at a corrected projection magnification.
Figure 7:
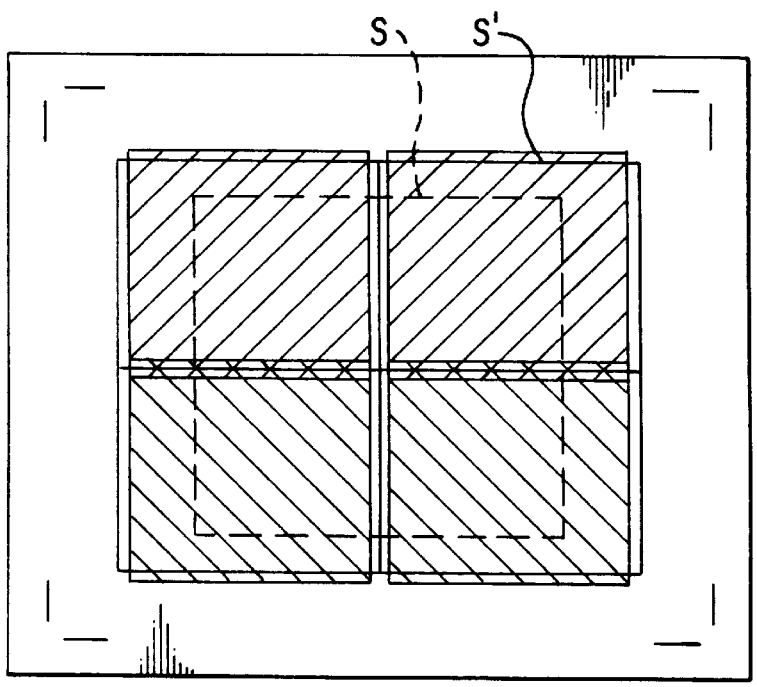
FIG. 7 shows a state of overlay exposure performed in accordance with a conventional technique.
Figure 7:
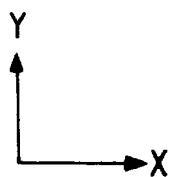

FIG. 6 shows an example of a pattern of the second layer exposed in a state in which the magnification has been adjusted on the basis of the magnification correction value m which affords an extreme preference to the y direction as described above. In FIG. 6, an area depicted by hatched lines indicates a pattern transfer area of the second layer. According to FIG. 6, it is understood that the pattern continuity and the overlay accuracy in the intended privileged direction (y direction) are much superior to those of the conventional example shown in FIG. 7.

As clarified from the foregoing explanation, in this embodiment, the magnification-correcting unit is realized by the magnification-adjusting mechanism 28 and the magnification controller 30, the mark detector is realized by the alignment microscope 32 and the function of the main control unit 50, and the calculating unit and the setting unit are realized by the functions of the main control unit 50.

As explained above, according to this embodiment, a proper magnification correction value m is automatically set within the range of the scalings γ$_x$, γ$_y$ in the x and y directions obtained by measuring the alignment marks, namely within the following range:

γ$_y$≦m≦γ$_x$ (in the case of γ$_y$≦γ$_x$)

γ$_x$≦m≦γ$_y$ (in the case of γ$_x$≦γ$_y$).

The projection magnification of the projection optical system PL is adjusted in accordance with the setting. Therefore, the pattern continuity and the overlay accuracy in an intended preferential direction can be improved only by previously determining the numbers of the alignment marks in accordance with the intended direction. It is approved that a more proper magnification correction value can be set at a higher possibility especially when the difference in scaling is large between the x and y directions.

In the method adopted in the embodiment described above in which the weighting is performed by using the numbers of the alignment marks in the x and y directions, the value of the plate scaling in the preferential direction is improved in its accuracy owing to the so-called averaging effect as the numbers of the marks increase.

It is noted that the flow chart described above includes a step in which the preferential direction can be set by an operator. Therefore, when the operator makes magnification correction while prioritizing an arbitrary direction, the operator may input arbitrary values as the parameters N, M corresponding to the numbers of the alignment marks from an unillustrated keyboard beforehand. For example, when a thin film transistor (TFT) is formed, source and drain layers are subjected to overlay exposure on a gate layer having been exposed. In this process, the magnification correction may be performed by prioritizing a direction for overlaying the source and drain layers. As described above, this embodiment adopts the process in which the magnification correction value can be set by the input made by the operator. Such a procedure is adopted so that the magnification may be easily changed considering occurrence of a situation in which a satisfactory result is not necessarily obtained due to any cause as a result of test exposure.

As explained above, according to the present invention, an excellent effect, which has not been achieved by the conventional technique, is obtained in that the pattern continuity and the overlay accuracy in an intended privileged direction can be improved when stretching of a substrate occurs due to downstream processes.

The foregoing embodiment has been explained as exemplified by the projection exposure apparatus of the step-and-repeat type. However, the exposure apparatus and the exposure method of the present invention are not limited thereto. The present invention can be applied to a projection exposure apparatus of the step-and-scan type. Especially, the present invention can be applied to a projection exposure apparatus of the scan-and-stitch type as one variation of the step-and-scan type in which exposure is performed while stitching exposure areas. It is needless to say that the exposure apparatus and the exposure method of the present invention can be applied not only to exposure for liquid crystal plates but also to exposure for semiconductor substrates. The present invention is not limited to the embodiment described above, which can be variously altered and modified within a range without departing from the spirit of the present invention. All alteration and modification which may be made by those skilled in the art are embraced in the scope of the present invention.

What is claimed is:

1. An exposure apparatus for transferring, successively in a stitching manner, a pattern formed on a mask through a projection optical system onto a plurality of areas existing continuously on a substrate, comprising:

a stage for placing the substrate thereon and movable in two orthogonal axial directions;

a mark detector for detecting positions of alignment marks previously formed in the two orthogonal axial directions on the substrate;

a magnification-correcting unit for correcting a magnification of the projection optical system;

a controller, which is connected to the mark detector, for calculating stretching degrees of the substrate in the two orthogonal axial directions respectively on the basis of information on the positions of the alignment marks detected by the detector and information on designed positions of the alignment marks, and for weighting each of the calculated stretching degrees in the two orthogonal axial directions by using different predetermined coefficients in the two orthogonal axial directions on the basis of the pattern respectively, and for controlling the magnification-correcting unit to adjust the magnification of the projection optical system depending on the weighted stretching degrees.

2. The exposure apparatus according to claim 1, wherein the mark detector detects numbers of the alignment marks, and the controller weights each of the stretching degrees in the two orthogonal axial directions in conformity with the detected numbers of the marks.

3. The exposure apparatus according to claim 1, wherein the controller allows the stretching degree in one axial direction of the two orthogonal axial directions to have a weighting coefficient of 1, and the stretching degree in the other axial direction to have a weighting coefficient of 0.

4. The exposure apparatus according to claim 1, wherein the magnification-correcting unit is one of a unit for correcting the magnification by adjusting a pressure of a gas existing between optical elements of the projection optical system, and a unit for correcting the magnification by moving, in a direction of an optical axis, a specified optical element of the projection optical system.

5. The exposure apparatus according to claim 1, wherein the apparatus is a projection exposure apparatus of the step-and-repeat type.

6. The exposure apparatus according to claim 1, wherein the apparatus is a projection exposure apparatus of the step-and-scan type.

7. An exposure apparatus for transferring, successively in a stitching manner, a pattern formed on a mask through a projection optical system onto a plurality of areas existing continuously on a substrate, comprising:
a stage for placing the substrate thereon and movable in two orthogonal axial directions;
a mark detector for detecting positions and numbers of alignment marks previously formed on the substrate corresponding to the two orthogonal axial directions respectively;
a magnification-correcting unit for correcting a magnification of the projection optical system;
a calculating unit, which is connected to the mark detector, for calculating stretching degrees of the substrate in the two orthogonal axial directions respectively on the basis of information on the positions of the alignment marks detected by the detector and information on designed positions of the alignment marks; and
a controller for weighting each of the calculated stretching degrees in the two orthogonal axial directions in accordance with the numbers of the alignment marks corresponding to the respective axial directions detected by the detector, and for controlling the magnification-correcting unit to adjust the magnification of the projection optical system depending on the weighted stretching degrees.

8. The exposure apparatus according to claim 7, wherein the magnification-correcting unit is one of a unit for correcting the magnification by adjusting a pressure of a gas existing between optical elements of the projection optical system and a unit for correcting the magnification by moving, in a direction of an optical axis, a specified optical element of the projection optical system.

9. The exposure apparatus according to claim 7, wherein the apparatus is a projection exposure apparatus of the step-and-repeat type.

10. The exposure apparatus according to claim 7, wherein the apparatus is a projection exposure apparatus of the step-and-scan type.

11. An exposure method for transferring, successively in a stitching manner, a pattern formed on a mask through a projection optical system onto a plurality of areas existing continuously on a substrate, comprising the steps of:
detecting positions of alignment marks previously formed in two orthogonal axial directions on the substrate;
calculating stretching degrees of the substrate in the two orthogonal axial directions respectively on the basis of information on the detected positions of the alignment marks and information on designed positions of the alignment marks;
determining weighted stretching degrees by weighting each of the calculated stretching degrees in the two orthogonal axial directions in conformity with an intended prioritized axial direction on the basis of the pattern;
adjusting a magnification of the projection optical system on the basis of the weighted stretching degrees; and
exposing, at the adjusted magnification, the plurality of areas existing continuously on the substrate with the pattern formed on the mask by means of projection in the stitching manner.

12. The exposure method according to claim 11, further comprising the steps of detecting numbers of the alignment marks, and determining the weighted stretching degrees by weighting each of the stretching degrees in the two orthogonal axial directions in conformity with the detected numbers of the alignment marks.

13. The exposure method according to claim 11, wherein the stretching degree in one axial direction of the two orthogonal axial directions is allowed to have a weighting coefficient of 1, and stretching degree in the other axial direction is allowed to have a weighting coefficient of 0.

14. An exposure method for transferring patterns formed on masks through a projection optical system onto a substrate, comprising the steps of:
transferring, successively in a stitching manner, a first pattern onto a plurality of areas existing continuously on the substrate, the pattern including alignment marks formed in two orthogonal axial directions on a mask;
detecting positions of alignment marks transferred in two orthogonal axial directions on the substrate;
calculating stretching degrees of the substrate in the two orthogonal axial directions respectively on the basis of information on the detected positions of the alignment marks and information on designed positions of the alignment marks;
determining weighted stretching degrees by weighting each of the calculated stretching degrees in the two orthogonal axial directions on the basis of a second pattern to be overlaid and exposed on the first pattern formed on the substrate;
adjusting a magnification of the projection optical system on the basis of the determined weighted stretching degrees; and
transferring, in the stitching manner at the adjusted magnification, the second pattern onto the plurality of areas existing continuously on the substrate.

15. The exposure method according to claim 14, further comprising the steps of detecting numbers of the alignment marks, and determining the weighted stretching degrees by weighting each of the stretching degrees in the two orthogonal axial directions in conformity with the detected numbers of the alignment marks.

16. The exposure method according to claim 14, wherein the stretching degree in one axial direction of the two orthogonal axial directions is allowed to have a weighting coefficient of 1, and the stretching degree in the other axial direction is allowed to have a weighting coefficient of 0.

17. The exposure method according to claim 14, wherein the method is a projection exposure method of the step-and-repeat type.

18. The exposure method according to claim 14, wherein the method is a projection exposure method of the step-and-scan type.

19. The exposure method according to claim 14, wherein the magnification is corrected by adjusting a pressure of a gas existing between optical elements of the projection optical system.

20. The exposure method according to claim 14, wherein the magnification is corrected by moving, in a direction of an optical axis, a specified optical element of the projection optical system.

21. The exposure apparatus according to claim 1, wherein the controller controls the magnification-correcting unit so as to correct the magnification by identically weighted stretching degrees for the plurality of areas when each of the plurality of areas is exposed.

22. The exposure apparatus according to claim 7, wherein the controller controls the magnification-correcting unit so as to correct the magnification by identically weighted stretching degrees for the plurality of areas when each of the plurality of areas is exposed.

23. The exposure method according to claim 14, wherein the first pattern is that of a gate layer of a thin film transistor, and the second pattern is that of source and drain layers of the thin film transistor.

24. The exposure method according to claim 23, wherein the weighted stretching degrees are determined on the basis of a direction in which the patterns of the source layer and the drain layer are overlaid.

25. An exposure apparatus for transferring a pattern formed on a mask onto a substrate, comprising:

a stage for placing the substrate thereon and movable in two orthogonal axial directions;

a mark detector for detecting positions of alignment marks formed in the two orthogonal axial directions on the substrate; and a controller, which is connected to the mark detector, for calculating stretching degrees of the substrate in the two orthogonal axial directions respectively on the basis of information on the positions of the alignment marks detected by the detector and information on designed positions of the alignment marks, and for weighting each of the calculated stretching degrees in the two orthogonal axial directions on the basis of a directional characteristic of the pattern.

26. The exposure apparatus according to claim 25, wherein when a second pattern is overlaid and exposed on a first pattern formed on the substrate, the controller weights each of the calculated stretching degrees in the two orthogonal axial directions on the basis of a directional characteristic of the second pattern.

27. An exposure apparatus for transferring a pattern formed on a mask on a substrate, comprising:

a stage for placing the substrate thereon and movable in two orthogonal axial directions;

a mark detector for detecting positions and numbers of alignment marks previously formed on the substrate corresponding to the two orthogonal axial directions respectively; and a controller, which is connected to the mark detector, for calculating stretching degrees of the substrate in the two orthogonal axial directions respectively on the basis of information on the positions of the alignment marks detected by the detector and information on designed positions of the alignment marks, and for weighting each of the calculated stretching degrees in the two orthogonal axial directions in accordance with the numbers of the alignment marks corresponding to the respective axial directions detected by the detector.

28. The exposure apparatus according to claim 27, further comprising a projection optical system, disposed between the mask and the substrate, for projecting the pattern of the mask onto the substrate, the mark detector being disposed in a predetermined positional relation to an optical axis of the projection optical system.

29. The exposure apparatus according to claim 27, further comprising a projection optical system, disposed between the mask and the substrate, for projecting the pattern of the mask onto the substrate, and a magnification-correcting unit, connected to the controller, for correcting a magnification of the projection optical system;

the controller controlling the magnification-correcting unit to adjust the magnification of the projection optical system depending on the weighted stretching degrees.

30. An exposure method for transferring patterns formed on masks onto a substrate, comprising the steps of:

detecting positions of alignment marks previously formed in two orthogonal axial directions on the substrate;

calculating stretching degrees of the substrate in the two orthogonal axial directions respectively on the basis of information on the detected positions of the alignment marks and information on designed positions of the alignment marks; and weighting each of the calculated stretching degrees in the two orthogonal axial directions in conformity with an intended prioritized direction on the basis of the pattern.

31. An exposure method for transferring patterns formed on masks onto a substrate, comprising the steps of:

transferring a first pattern on the substrate, the pattern including alignment marks formed in two orthogonal axial directions on a mask;

detecting positions of alignment marks transferred in two orthogonal axial directions on the substrate;

calculating stretching degrees of the substrate in the two orthogonal axial directions respectively on the basis of information on the detected positions of the alignment marks and information on designed positions of the alignment marks; and weighting each of the calculated stretching degrees in the two orthogonal axial directions on the basis of a second pattern to be overlaid and exposed on the first pattern formed on the substrate.

* * * * *

UNITED STATES PATENT AND TRADEMARK OFFICE
CERTIFICATE OF CORRECTION

PATENT NO. : 6,104,471
DATED : August 15, 2000
INVENTOR(S) : Toshinobu Morioka et al.

It is certified that error appears in the above-indentified patent and that said Letters Patent is hereby corrected as shown below:

On title page item,

[63], please change as follows:

Continuation of Application No. 08/669,238, Jun. 24, 1996, abandoned.

Signed and Sealed this

Twenty-fourth Day of April, 2001

*Attest:*

NICHOLAS P. GODICI

*Attesting Officer*  *Acting Director of the United States Patent and Trademark Office*